United States Patent
Naito

(10) Patent No.: US 8,768,661 B2
(45) Date of Patent: Jul. 1, 2014

(54) METHOD FOR CREATING FINITE ELEMENT MODEL OF RUBBER COMPOSITE

(75) Inventor: Masato Naito, Kobe (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 351 days.

(21) Appl. No.: 13/288,068

(22) Filed: Nov. 3, 2011

(65) Prior Publication Data

US 2012/0232848 A1    Sep. 13, 2012

(30) Foreign Application Priority Data

Mar. 7, 2011 (JP) ................................. 2011-049309

(51) Int. Cl.
   *G06F 17/50* (2006.01)
(52) U.S. Cl.
   USPC ........................................ 703/2; 703/7; 703/9
(58) Field of Classification Search
   USPC ...................................... 703/2, 7, 9
   See application file for complete search history.

(56) References Cited

FOREIGN PATENT DOCUMENTS

| JP | 2005-351770 A | 12/2005 |
|----|---------------|---------|
| JP | 2007-271369 A | 10/2007 |
| JP | 2009-193339 A | 8/2009 |
| JP | 2009-276147 A | 11/2009 |
| JP | 2009-282569 A | 12/2009 |

*Primary Examiner* — Thai Phan
(74) *Attorney, Agent, or Firm* — Birch, Stewart, Kolasch & Birch, LLP

(57) ABSTRACT

A computerized method for creating a 2D or 3D finite element model of a rubber composite of a rubber matrix and fillers is disclosed. In the case of the 2D finite element model, a primary finite element model of the rubber composite is first created by defining a rubber matrix model of the rubber matrix and filler models of the fillers by the use of rectangular elements. Then, a second finite element model as the target 2D finite element model is created by moving boundary nodes positioned at boundaries between the rubber matrix model and filler models in the primary finite element model so that concavity and convexity of the surface of each filler model becomes less, whereby, in the second finite element model, some of the rectangular elements including the moved boundary nodes are deformed, but the rest of the rectangular elements are not deformed.

8 Claims, 19 Drawing Sheets

METHOD FOR CREATING FINITE ELEMENT MODEL OF RUBBER COMPOSITE

BACKGROUND OF THE INVENTION

The present invention relates to a computerized method for creating a two-dimensional or three-dimensional finite element model of a rubber composite comprising a rubber matrix and fillers, capable of improving the accuracy of computer simulations.

In recent years, a finite element method is widely employed in various computer simulations. In such computer simulation, an analysis object is discretized into a finite number of elements, and a finite element model is created by the use of the elements. The finite element model is provided with various characteristics, and a deformation calculation is made by calculating displacements of nodes of the elements.

In the case that the analysis object is a rubber composite (b) comprising a rubber matrix (c) and fillers (d) dispersed therein, a finite element model (a) including a model (g) of the rubber matrix (c) and models (h) of the fillers (d) is defined, for example, by using rectangular elements (e) as shown in FIG. 20(a).

In such finite element model (a), due to the rectangles, the surface of a filler model (h) has remarkable concavity and convexity (i) as shown in FIG. 20(b). As a result, at the boundary between the filler model (h) and the rubber matrix model (g), the contact range (area) therebetween becomes increased, and the rubber matrix model (g) is restrained by the filler models (h) and the deformation is inhibited since the rubber has incompressibility and the rubber matrix model (g) is accordingly defined as having incompressibility.

Therefore, in the part (or elements) of the rubber matrix model abutting the filler models (h), the rigidity of the rubber matrix model (g) is calculated as if it is higher than it really is, and thereby the simulation accuracy is decreased. This is also true in the case of a three-dimensional model using hexahedron elements as shown in FIG. 15.

SUMMARY OF THE INVENTION

It is therefore, an object of the present invention to provide a computerized method for creating a finite element model of a rubber composite capable of improving the accuracy of computer simulations.

According to one aspect of the present invention, the computerized method is for creating a two-dimensional finite element model of a rubber composite and comprises creating a primary finite element model of the rubber composite by defining a rubber matrix model of the rubber matrix and filler models of the fillers by the use of rectangular elements having square shapes and/or oblong shapes, and creating a second finite element model as the two-dimensional finite element model by moving boundary nodes positioned at boundaries between the rubber matrix model and filler models in the primary finite element model so that concavity and convexity of the surface of each filler model becomes less, whereby, in the second finite element model, some of the rectangular elements including the moved boundary nodes are deformed. and the rest of the rectangular elements are not deformed.

According to another aspect of the present invention, the computerized method is for creating a three-dimensional finite element model of a rubber composite and comprises creating a primary finite element model of the rubber composite by defining a rubber matrix model of the rubber matrix and filler models of the fillers by the use of hexahedron elements, and creating a second finite element model as the tree-dimensional finite element model by moving boundary nodes positioned at boundaries between the rubber matrix model and filler models in the primary finite element model so that concavity and convexity of the surface of each filler model becomes less, whereby, in the second finite element model, some of the hexahedron elements including the moved boundary nodes are deformed. and the rest of the hexahedron elements are not deformed.

Therefore, in the computerized methods according to the present invention, the surfaces of the filler models or the boundaries between the filler models and rubber matrix model become smoother and the contact range (area) becomes decreased, As a result, the restraint by the filler models is reduced, and the overestimation of the rigidity in the abutting part is prevented. Thereby, the simulation accuracy can be improved. Further, in the finite element models created by the methods according to the present invention, some of the elements are deformed, but the rest of (most of) the elements are not deformed, therefore, the processing time can be greatly reduced in comparison with a finite element model, all elements of which are reduced in the sizes in order to smoothen the surfaces or boundaries.

DESCRIPTION OF THE PREFERRED EMBODIMENTS

Embodiments of the present invention will now be described in detail in conjunction with the accompanying drawings.

In the method according to the present invention, a two-dimensional or three-dimensional finite element model (2, 20) of a rubber composite (b) comprising a rubber matrix (c) and fillers (d) dispersed therein is created by the use of a computer 1 in order to simulate deformation of the rubber composite (b) by the use of a computer 1.

As to the simulation method, various methods may be employed regardless of known or unknown types, therefore, the description is omitted here.

The fillers (d) are fine particles having rigidity higher than the rubber matrix (c), for example, carbon black, silica and the like, and each filler (d) is treated as having a round shape. In the case of two-dimensional model, the "round shape" means a circle, oval and the like. In the case of three-dimensional model, the "round shape" means a sphere, spheroid and the like.

Figure 1:
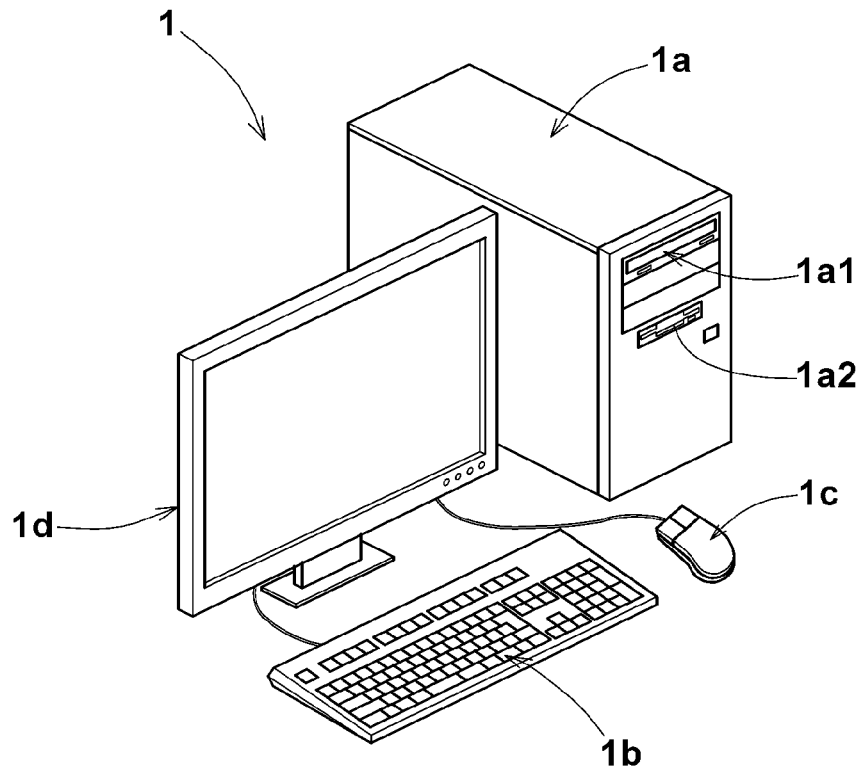
FIG. 1 shows a computer for executing the method according to the present invention.

As for the computer 1, a general-purpose computer such as workstation can be used. For example, as shown in FIG. 1, the computer 1 comprises a main body 1a, a keyboard 1b, a mouse 1c and a display 1d. The main body 1a comprises an arithmetic processing unit (CPU), ROM, working memory, storage devices such as magnetic disk, disk drives 1a1 and 1a2 and the like. In the storage device, programs/softwares for carrying out the creating method are stored.

Figure 2:
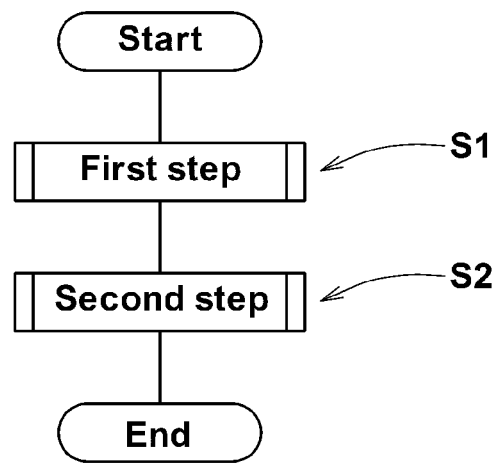
FIG. 2 is a flowchart of the method according to the present invention.

FIG. 2 shows a flowchart of the method according to the present invention, wherein
firstly, a primary finite element model 2A, 20A including a rubber matrix model 4, 22 of the rubber matrix (c) and a plurality of filler models 5, 23 of the fillers (d) is created by the use of finite elements 6, 24 (first step S1), and then, based on the primary finite element model 2A, 20A, by deforming only elements 6, 24 which include boundary nodes 7A, 25A at the boundaries between the filler models and the rubber matrix model, a second finite element model 2B, 20B is created as the target model 2, 20 (second step S2).

First Embodiment

Two-Dimensional Finite Element Model 2

Figure 8:
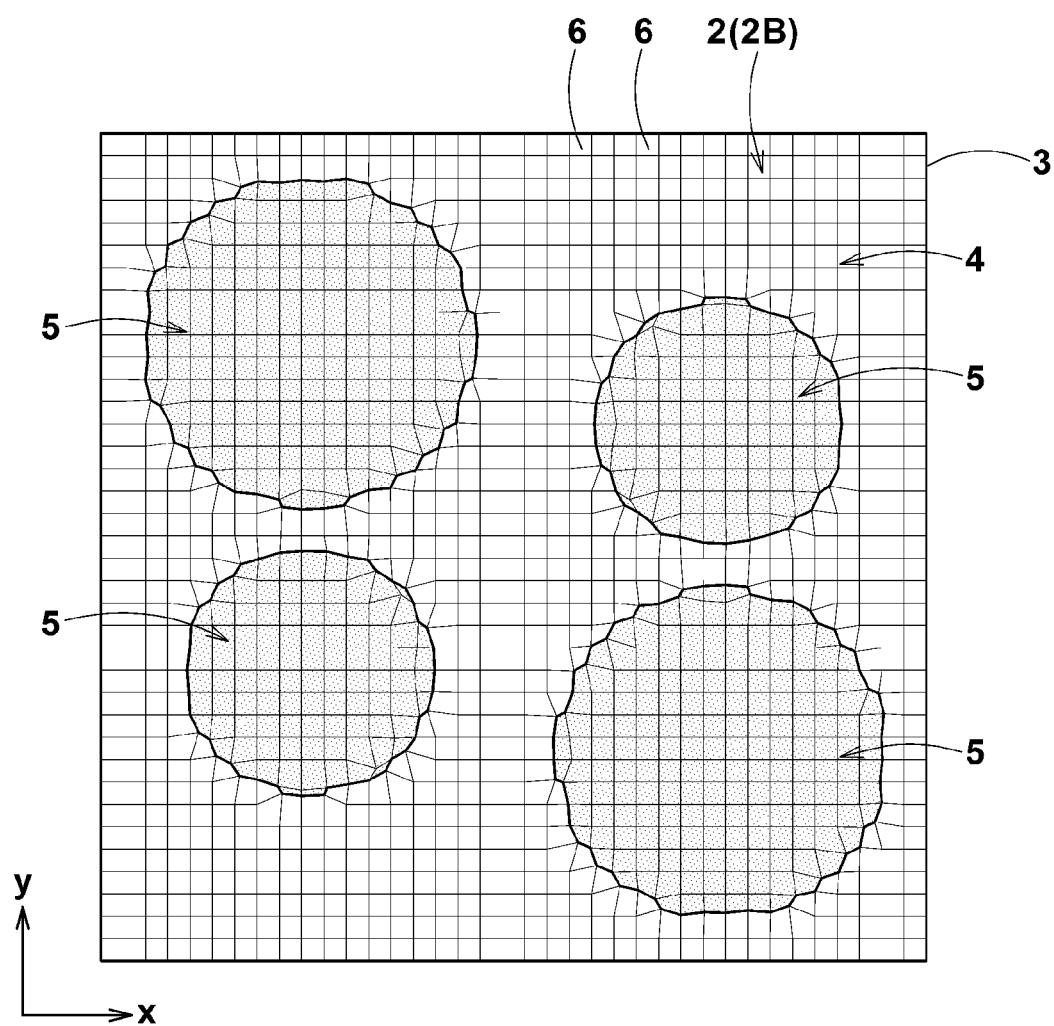
FIG. 8 shows a two-dimensional second finite element model.
Figure 19:
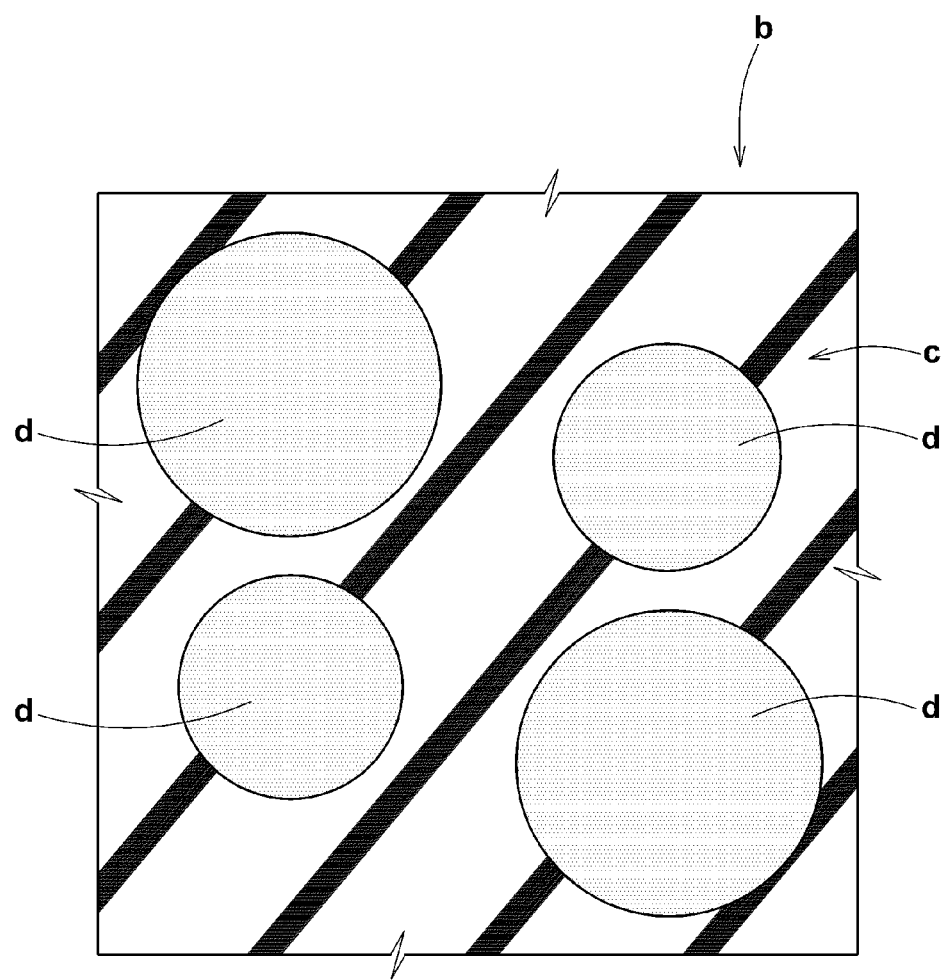
FIG. 19 is a diagrammatic cross sectional view of the rubber composite.

In the method according to the first embodiment of the present invention, a two-dimensional finite element model 2 (as shown in FIG. 8) of a rubber composite (b) (as shown in FIG. 19) is created.

In this embodiment, the rubber composite is treated as a two-dimensional space 3 for example having a square shape of which each side has a length L1 of about 50 to 150 nm.

The two-dimensional space is meshed with rectangular elements 6 having square shape and/or oblong shape (in this example square elements only). Thus, each element 6 has four nodes 7 and four straight sides 8 extending between the four nodes 7. The length L2 of each side 8 is for example set in a range of about 0.1 to 3 nm.

Figure 3:
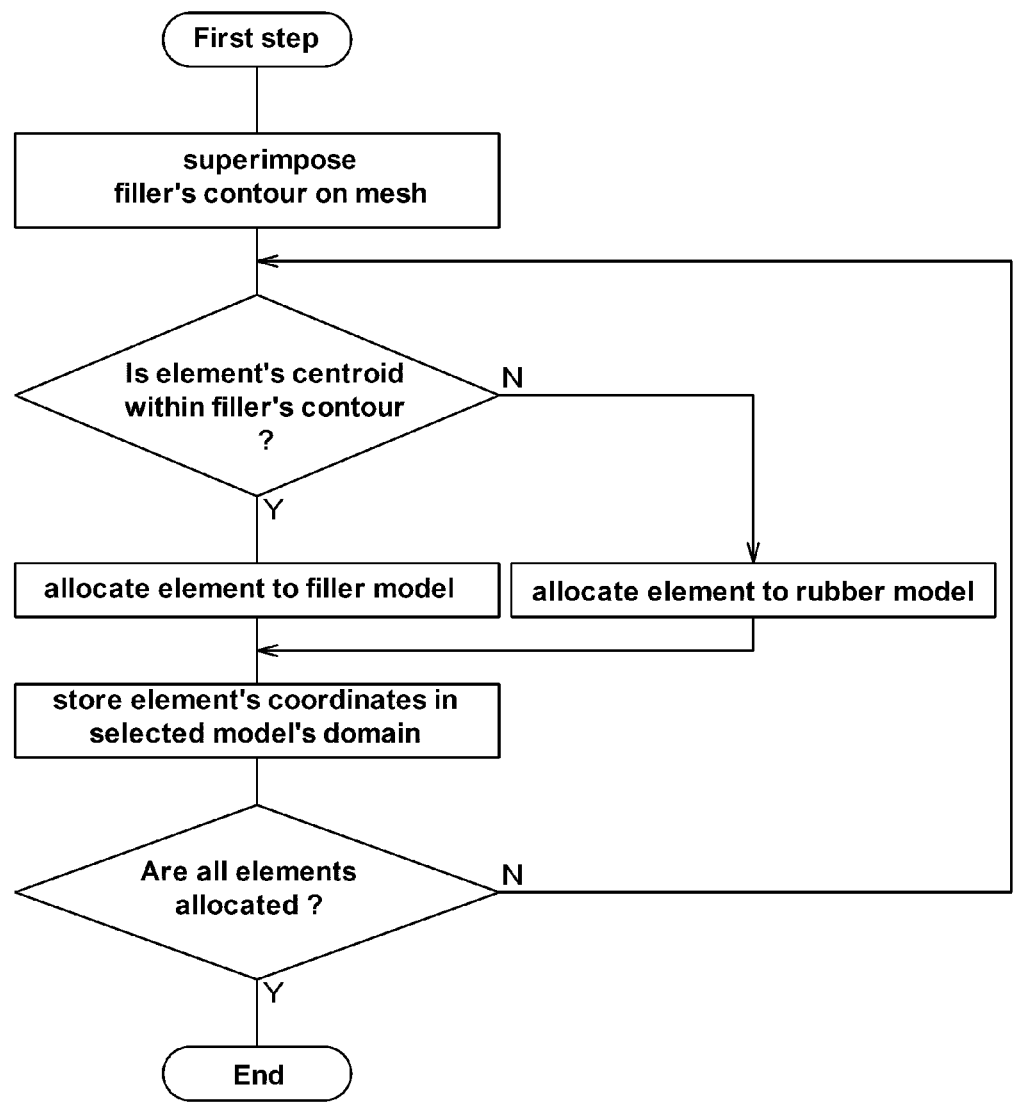
FIG. 3 is a flowchart of a first step of the method.

In the first step S1 in this embodiment, as shown in FIG. 3, with the computer 1, the elements 6 are each allocated to the rubber matrix (c) or one of the fillers (d) to define a rubber matrix model 4 and filler models 5.

Figure 5A:
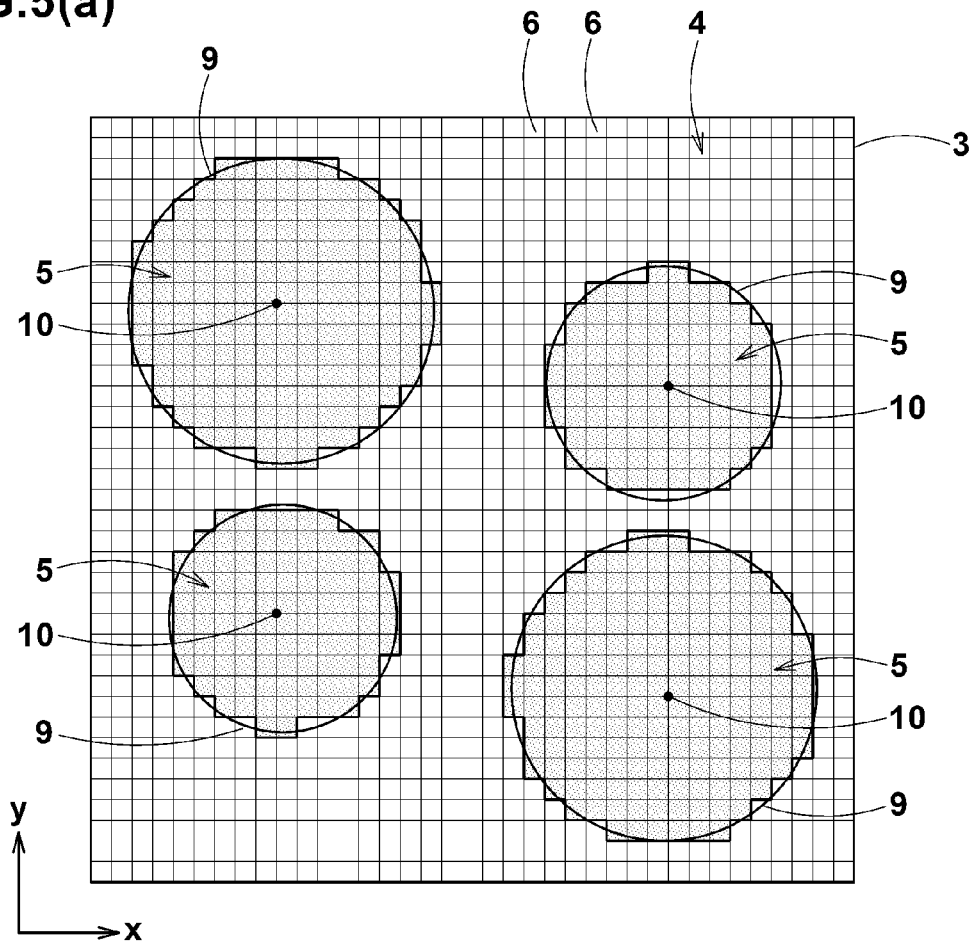
FIG. 5(a) shows a two-dimensional space.

Specifically, the contours 9 (or their coordinates stored beforehand) of the fillers (d) are superimposed on the elements 6 (or their coordinates) in the form of mesh as shown in FIG. 5(a).

Figure 5B:
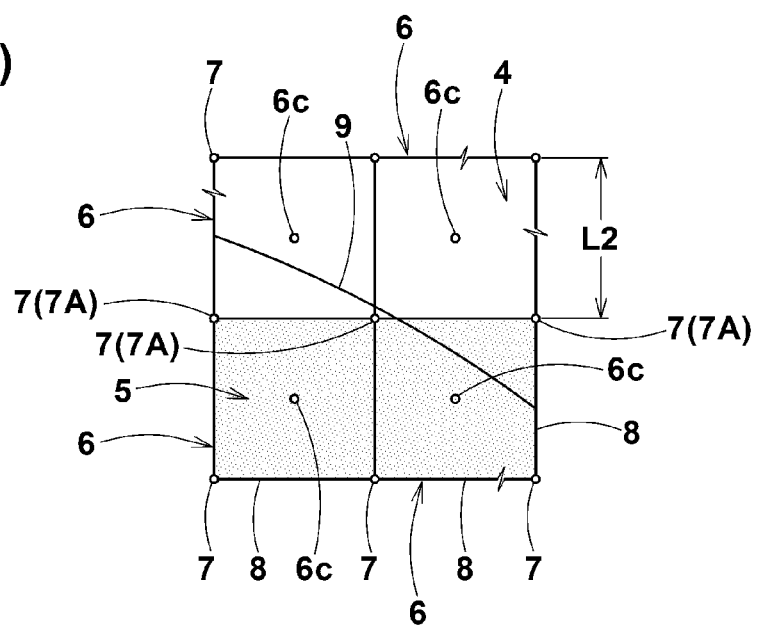
FIG. 5(b) is a closeup thereof.

Then, the filler model 5 of each filler (d) is defined by some of the elements 6 whose centroids 6c are within the contour 9 of the filler (d) concerned as shown in FIG. 5(b).

And by the rest of the elements 6, the rubber matrix model 4 of the rubber matrix (c) is defined.

Figure 6:
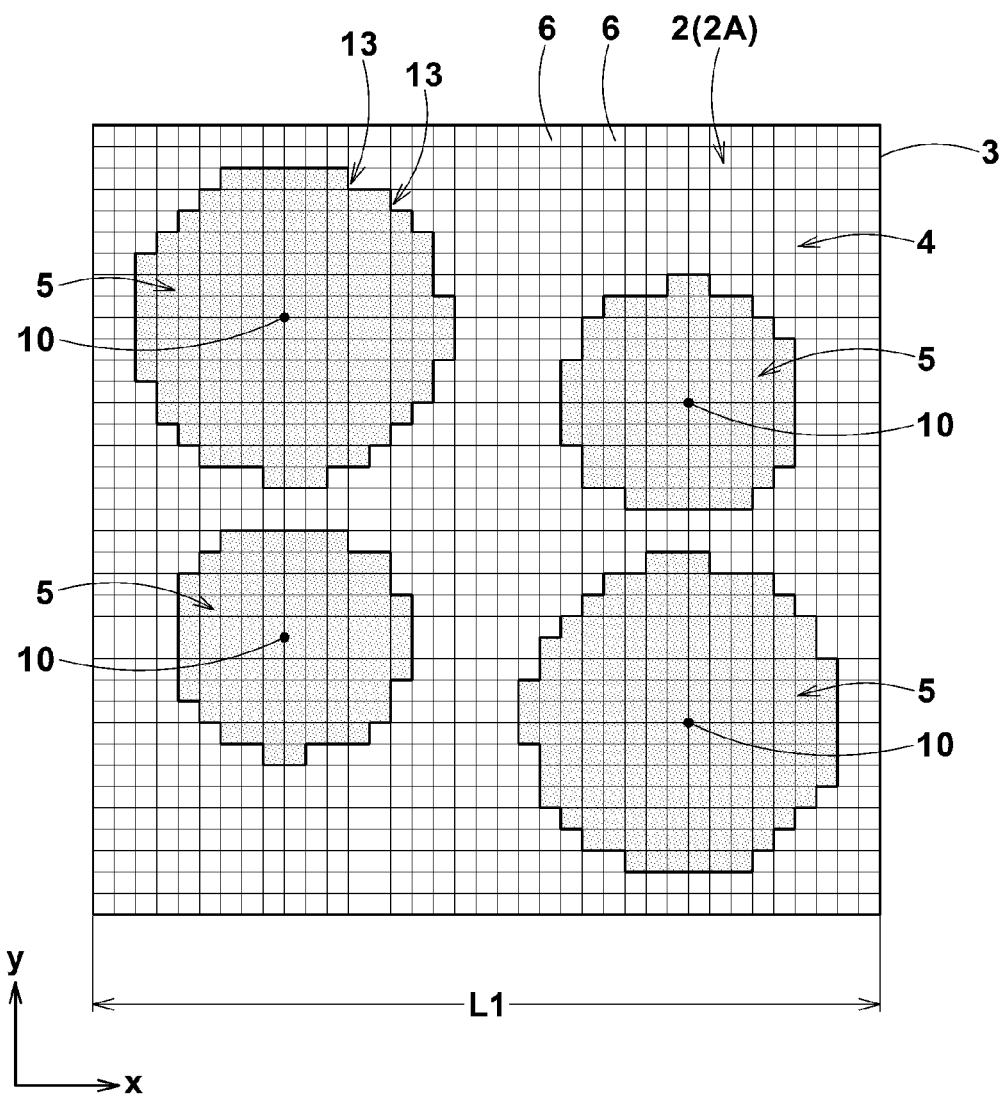
FIG. 6 shows a two-dimensional primary finite element model.

The computer 1 stores the data such as coordinates of each element in the filler's domain or rubber's domain in the memory. Thereby, as shown in FIG. 6, the primary finite element model 2A of the two-dimensional space 3 including the rubber matrix model 4 and filler models 5 is defined.

In the second step S2 in this embodiment, with the computer 1, some boundary nodes 7A (shown in FIG. 5(b)) of the nodes 7 located at the boundaries between the rubber matrix model 4 and the filler models 5 of the primary finite element model 2A are moved so that the concavity and convexity 13 (shown in FIG. 6) of the surface of each filler model 5 becomes less to thereby create or redefine the second finite element model 2B (shown in FIG. 8) including the deformed elements 6 of which the boundary nodes 7A at the boundaries are moved as above.

Figure 4:
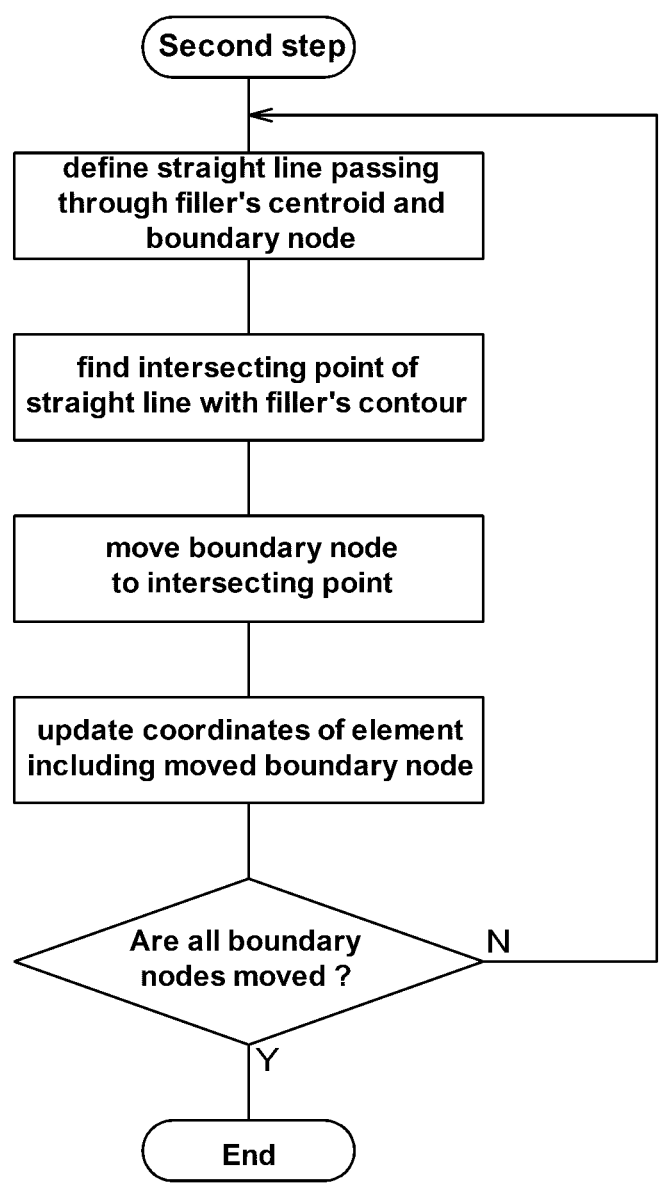
FIG. 4 is a flowchart of a second step of the method.
Figure 7A:
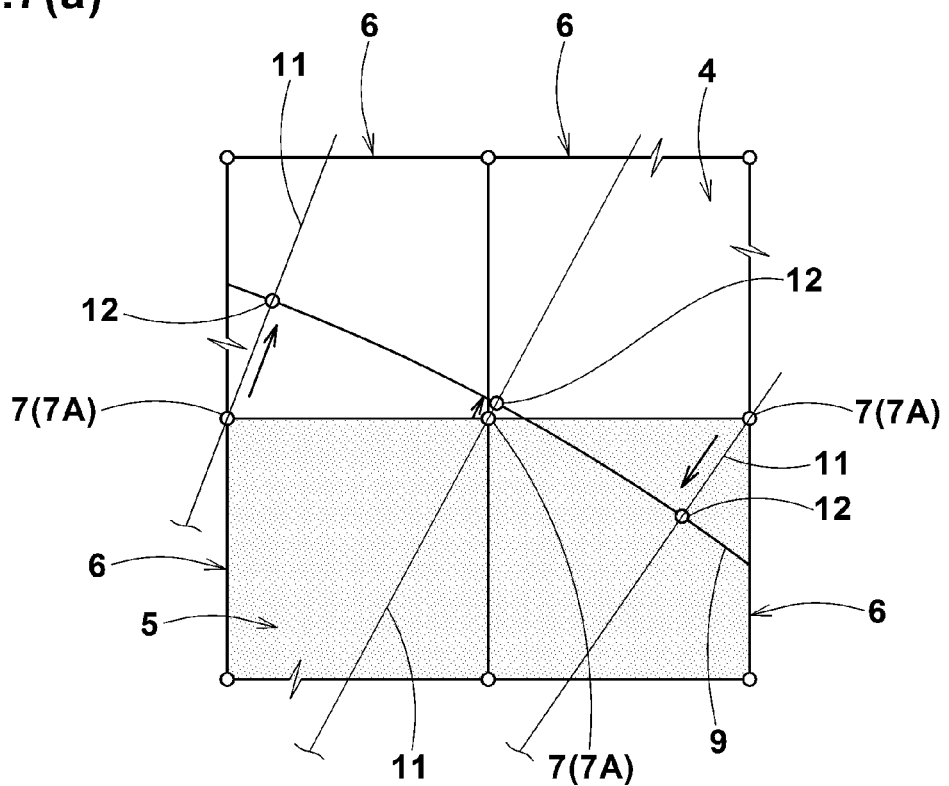
FIG. 7(a) is a closeup of FIG. 6.
Figure 7B:
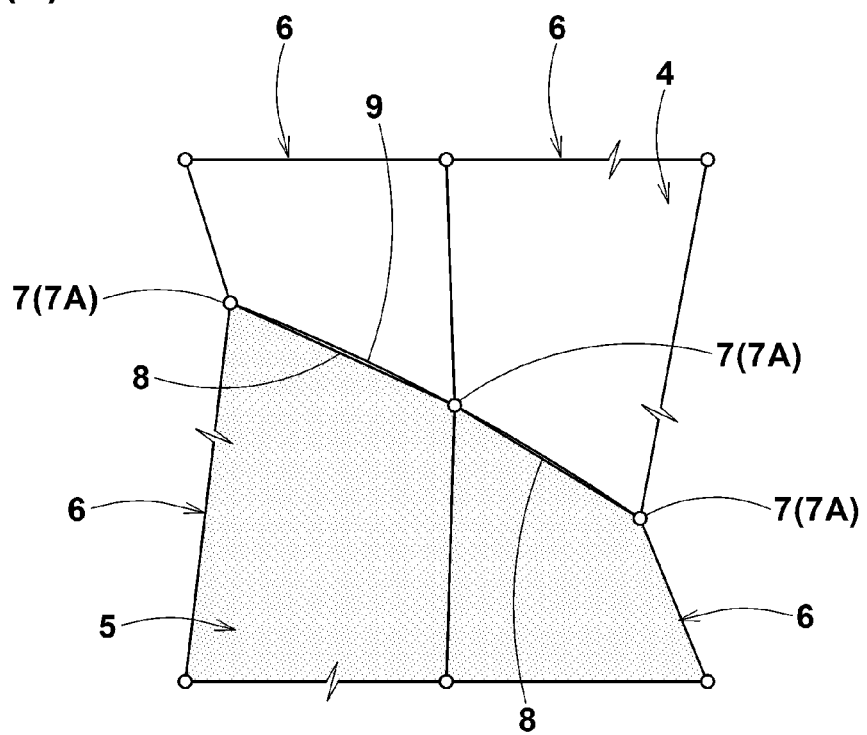
FIG. 7(b) is a closeup of FIG. 8.

Specifically, as shown in FIG. 4 and FIGS. 7(a) and 7(b), with the computer 1, the boundary node 7A at the boundary is usually moved to an intersecting point 12 of the contour 9 of the filler (d) with a straight line 11 drawn passing through the boundary node 7A and the centroid 10 of the filler (d).

By the movements of the boundary nodes 7A at the boundaries, only the elements 6 including the boundary nodes 7A are deformed, and the second finite element model 2B as shown in FIG. 8 is defined.

Then, the computer 1 updates the coordinates of the respective elements 6 including the moved boundary nodes 7A.

In the second finite element model 2B, therefore, the concavity and convexity 13 of the surface of the filler model 5 is lessened. Further, the rest of the elements 6 none of the nodes 7 of which are positioned at the boundaries are not deformed or each maintain the same shape as in the primary finite element model 2A (in this embodiment, square shape). Thus, it is not necessary to update the coordinates, therefore, the processing time can be greatly reduced.

On each element 6 of the rubber matrix model 4 and filler models 5 of the second finite element model 2B, information necessary for numerical analyses made by a computer simulation is defined. The numerical analyses means a numerical analysis method such as finite element method.

The information necessary for the analyses includes at least the coordinates and indexes (identification numbers) of the nodes 7 of each element 6.

Further, on each element 6 of the rubber matrix model 4 and filler models 5 of the second finite element model 2B, material characteristics (physical properties) of the part corresponding to the concerned element 6 are defined. Specifically, material constants corresponding to the physical properties of the rubber matrix (c) and material constants corresponding to the physical properties of the filler (d) are respectively defined.

The computer 1 stores these data in the memory.

Figure 10A:
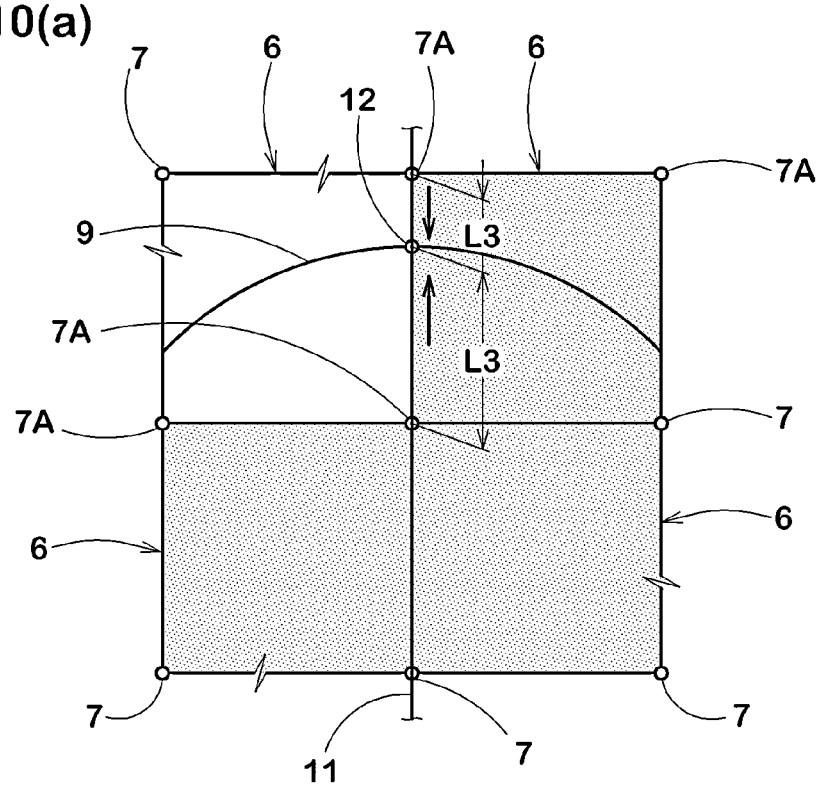
FIG. 10(a) and FIG. 10(b) show rectangular elements before and after deformed for explaining a method for avoiding an overlap of boundary nodes.

On the other hand, there is a possibility that, as shown in FIG. 10(a), a plurality of the boundary nodes 7A at the boundaries (usually two boundary nodes 7A) are located on one straight line 11.

In this case, if the boundary nodes 7A are moved to the intersecting point 12 of the straight line 11 and the contour 9 of the filler (d) in the second step S2, then these boundary nodes 7A are overlapped.

Such overlap of the nodes crushes the element 6 for example from the quadrilateral to a triangle, and it becomes impossible to compute the rigidity.

Therefore, in order to avoid such undesirable overlap, before moving the boundary nodes 7A at the boundaries to the intersecting points 12 in the second step S2,
the computer 1 checks, with respect to each boundary, whether a plurality of the boundary nodes 7A are located on one straight line 11 and there is a possibility of their overlap. (Overlap check step)

Figure 10B:
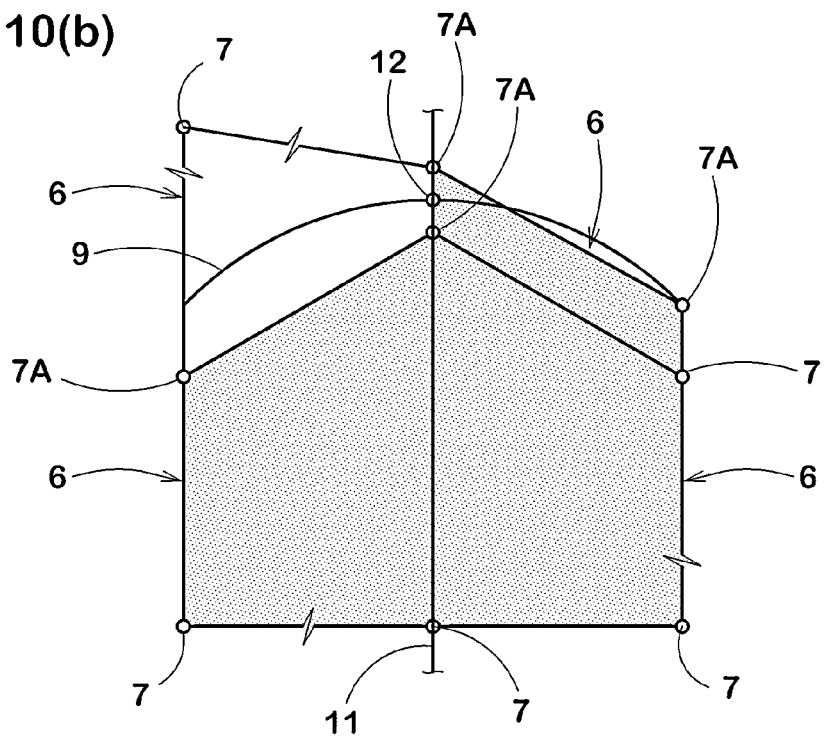
Figure 11:
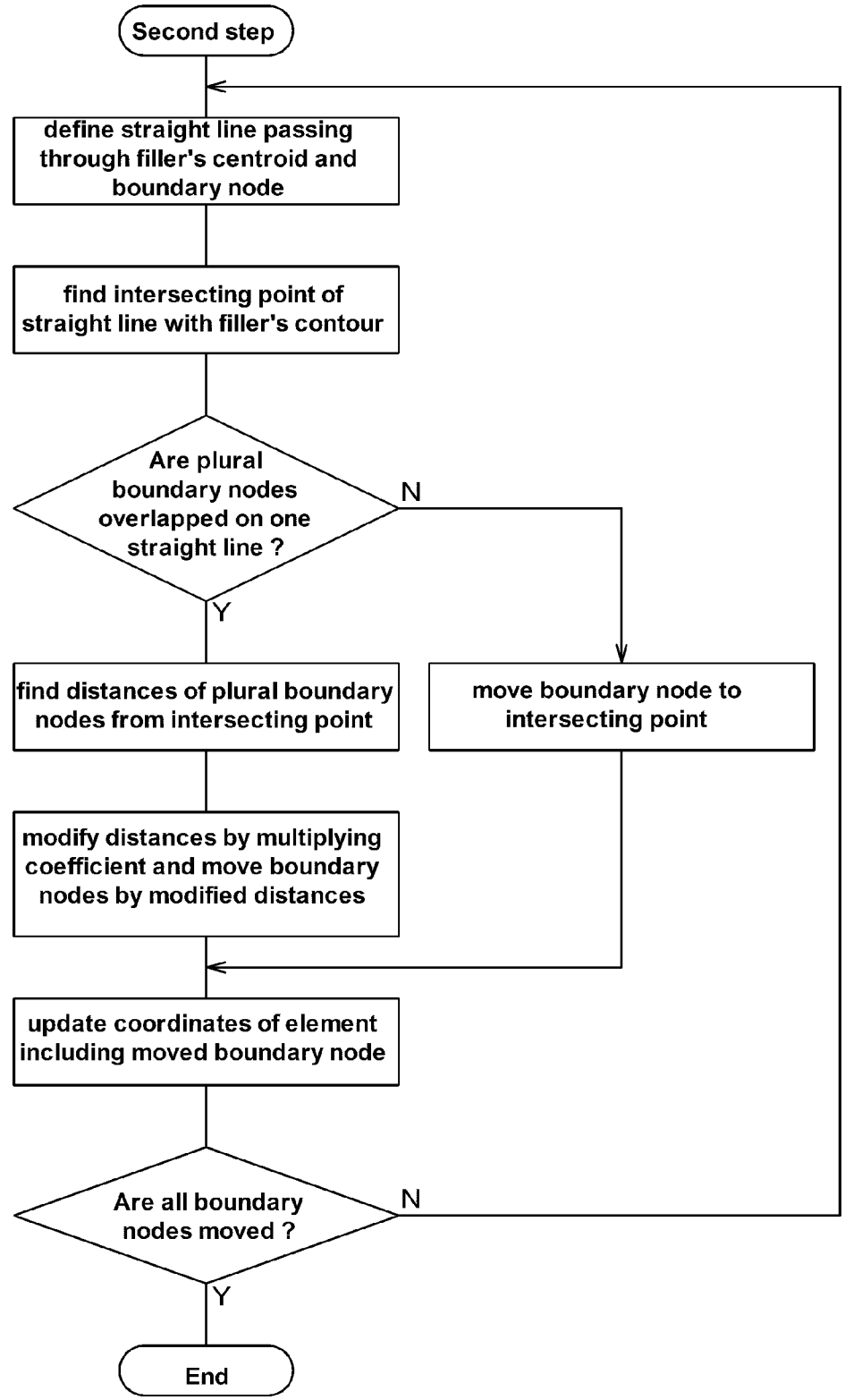
FIG. 11 is a flowchart of another example of the second step in which the method for avoiding the overlap is incorporated.

If it is decided that there is a possibility of overlap, as shown in FIGS. 10 and 11, with the computer 1,
the distances L3 of the boundary nodes 7A at the boundary concerned from the intersecting point 12 are calculated, and the distances L3 are modified by multiplying a coefficient in a range of more than 0 and less than 1 in order to obtain the modified distances L3'. (Distance modify step)

Then, the boundary nodes 7A are moved toward the intersecting point 12 to different positions on the straight line 11 by the respective modified distances L3' in stead of the original distances L3. Accordingly, as shown in FIG. 10(b), the undesirable overlap of the boundary nodes 7A can be avoided. Such overlap check step and distance modify step are carried out on all of the possible boundary nodes 7A.

Thus, the target two-dimensional finite element model is created. As a result, the accurate simulation is possible.

Figure 9:
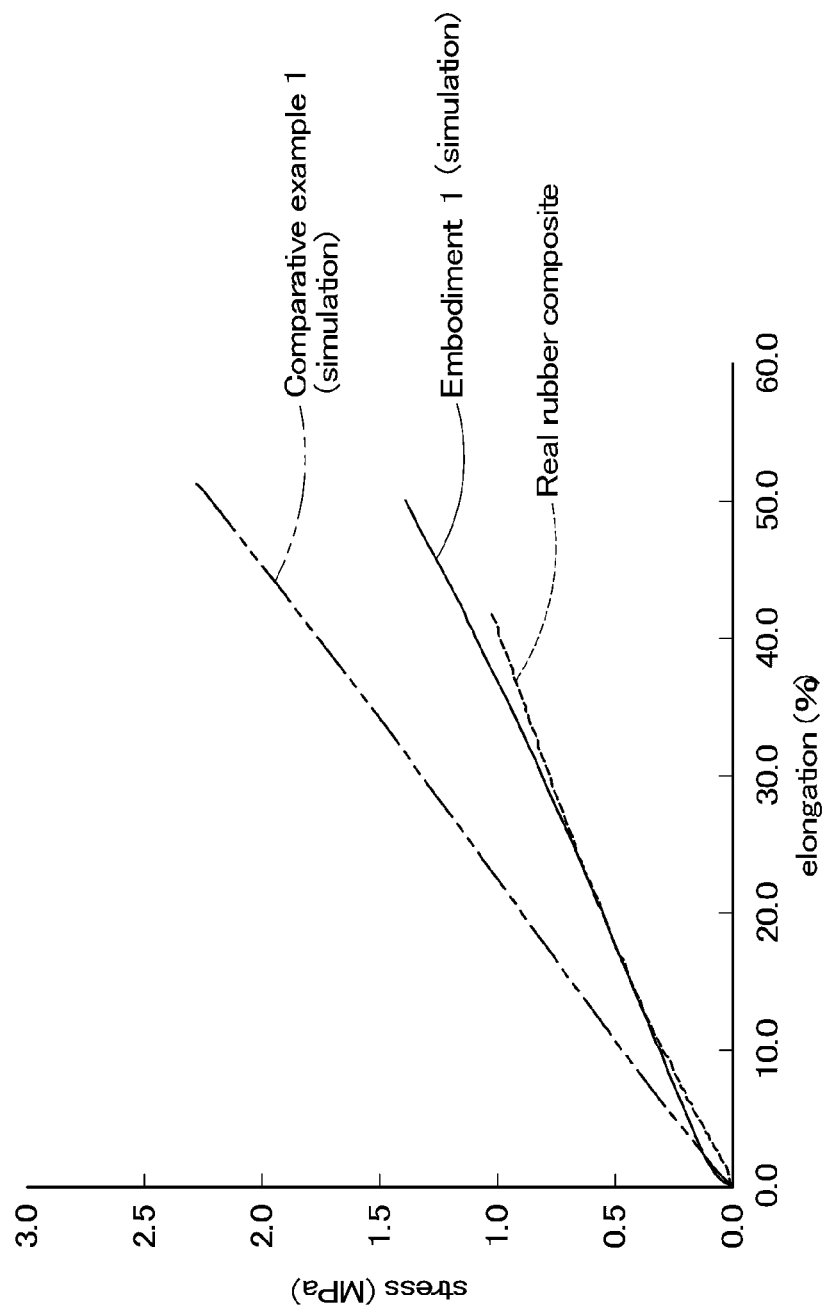
FIG. 9 is a graph showing a stress-elongation curve of a real rubber composite and those obtained by computer simulations.
Figure 20A:
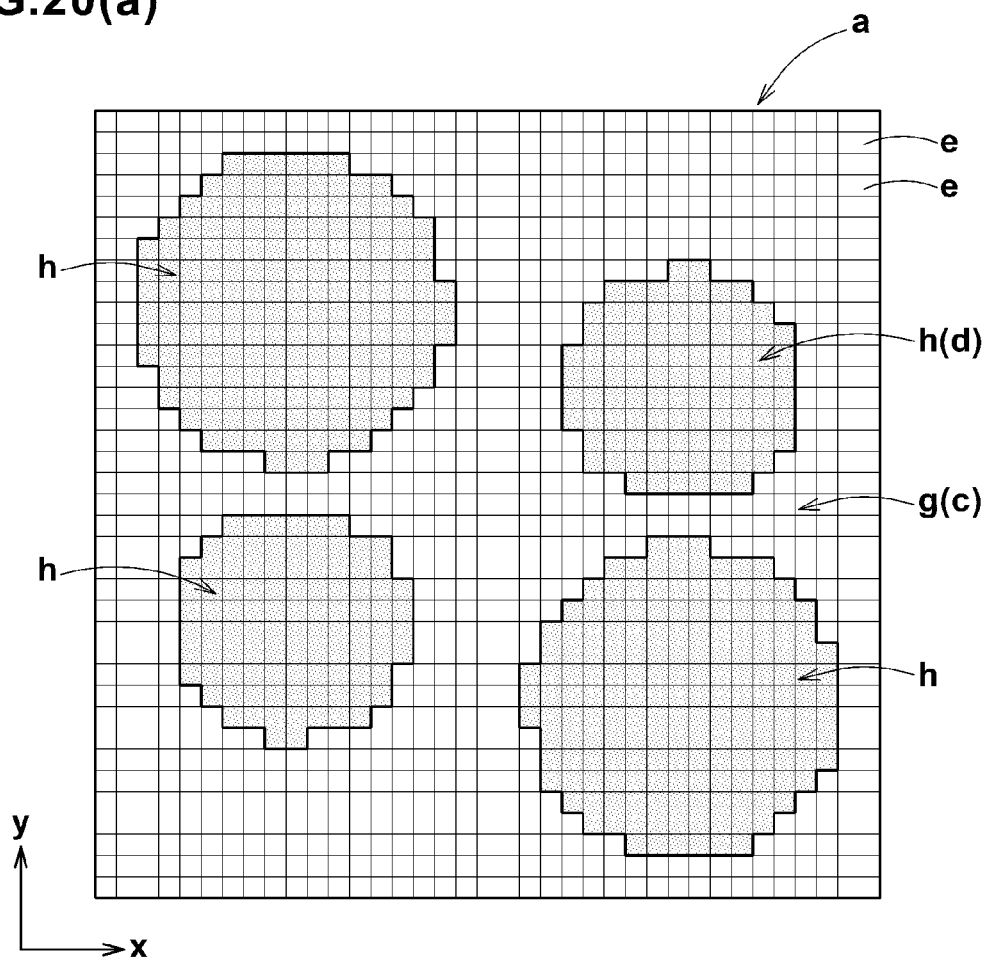
FIG. 20(a) shows a conventional finite element model.
Figure 20B:
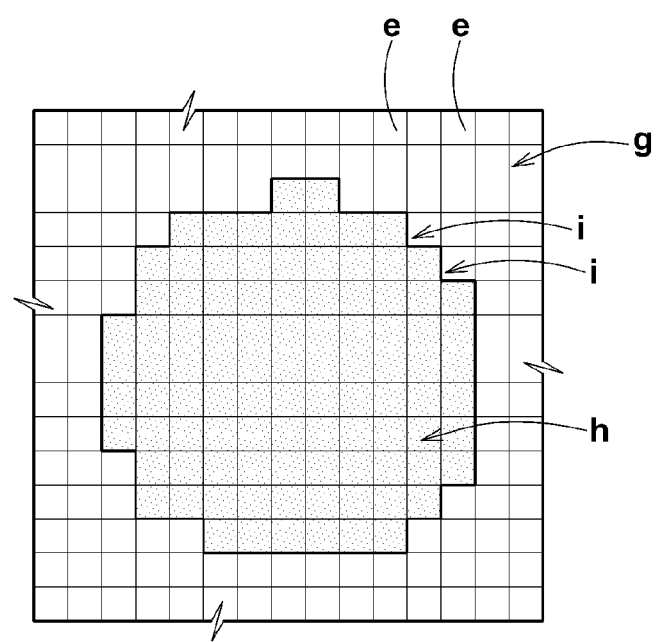
FIG. 20(b) is a closeup thereof.

For example, the rubber composite (b) shown in FIG. 19 displays a stress-elongation curve shown in FIG. 9 in broken line. In FIG. 9, also shown are
a stress-elongation curve in solid line obtained through a computer simulation utilizing the second finite element model 2B in this embodiment (Embodiment 1) shown in FIG. 8 (number of elements: 1600), and
a stress-elongation curve in alternate long and two short dashes line obtained through the computer simulation utilizing a finite element model (a) (comparative example 1) shown in FIG. 20(a) defined by square elements (e) only (number of elements: 1600). These simulation results show that the simulation accuracy of Embodiment 1 is superior to that of the comparative example 1.

Second Embodiment

Three-Dimensional Finite Element Model 20

Figure 12:
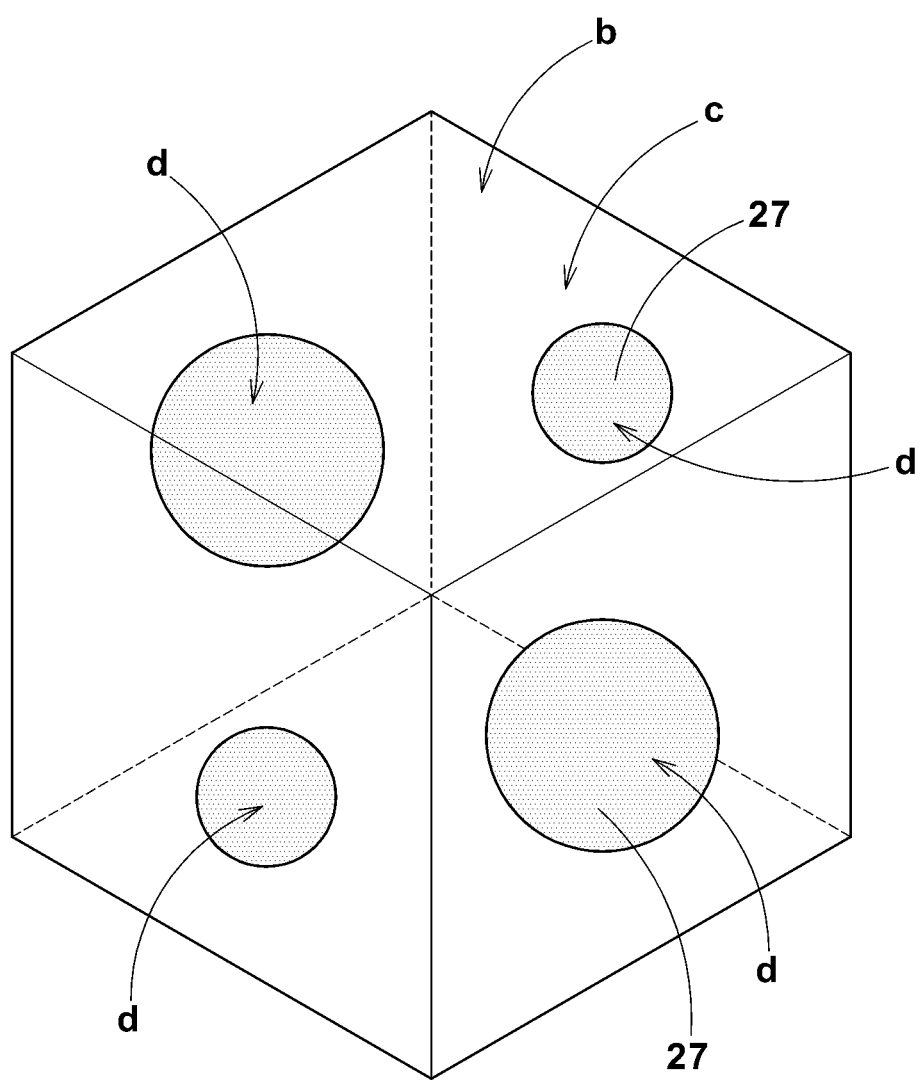
FIG. 12 is a diagrammatic perspective view of the rubber composite.
Figure 17:
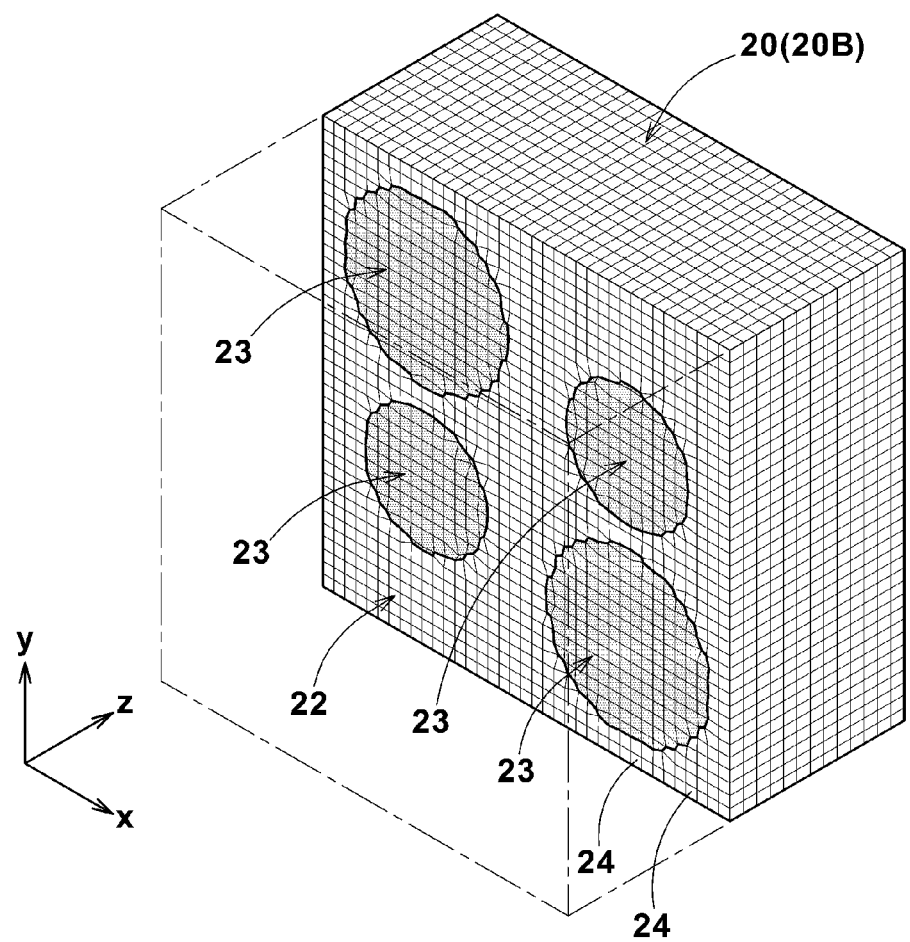
FIG. 17 is a perspective view showing a three-dimensional second finite element model.

In the method according to the second embodiment of the present invention, a three-dimensional finite element model 20 (as shown in FIG. 17) of a rubber composite (b) (as shown in FIG. 12) is created.

In this embodiment, the rubber composite is treated as a three-dimensional space 21 where the fillers (d) are three dimensionally dispersed in the rubber matrix (c).

Figure 13:
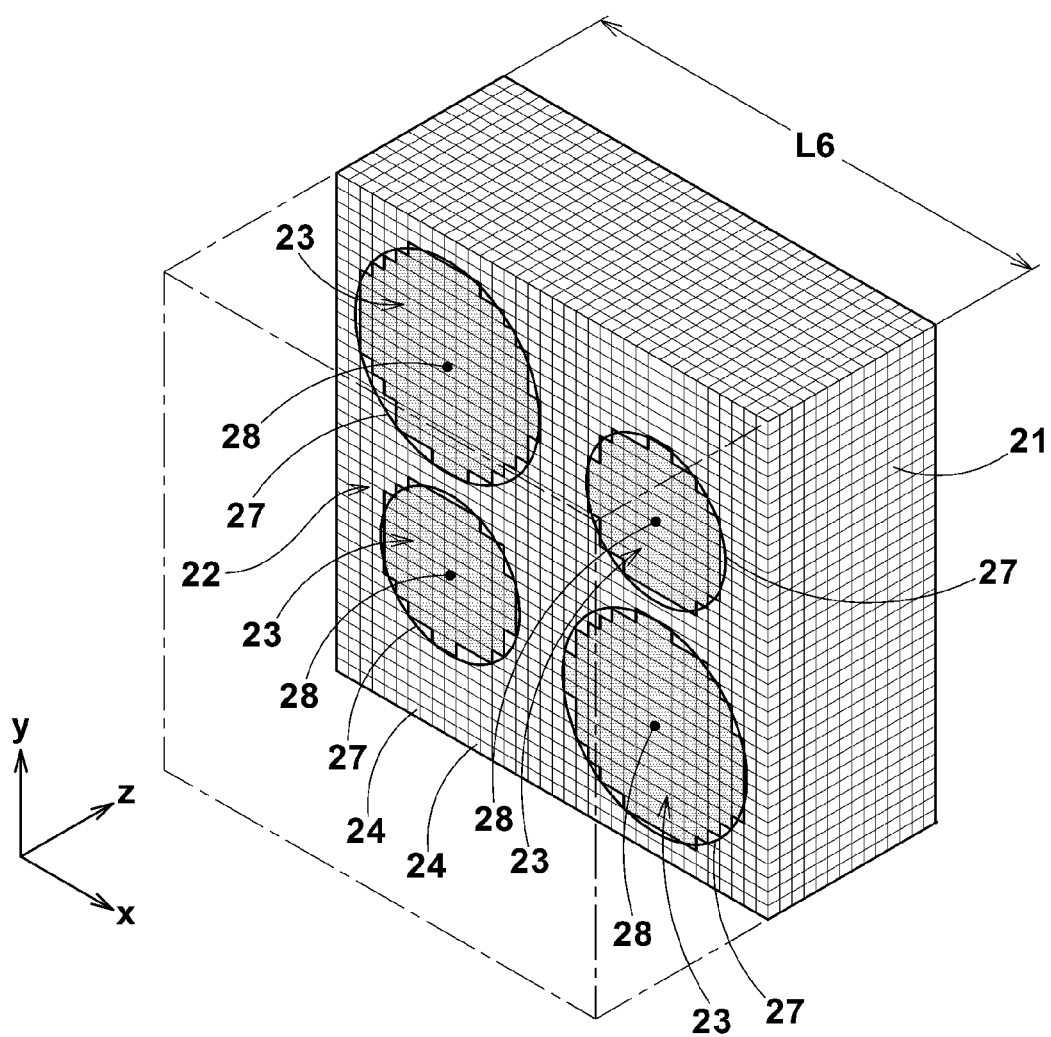
FIG. 13 is a perspective view showing a three-dimensional space.

For example, the three-dimensional space 21 is defined as a cube of which each side has a length L6 of about 50 to 150 nm as shown in FIG. 13.

Figure 14:
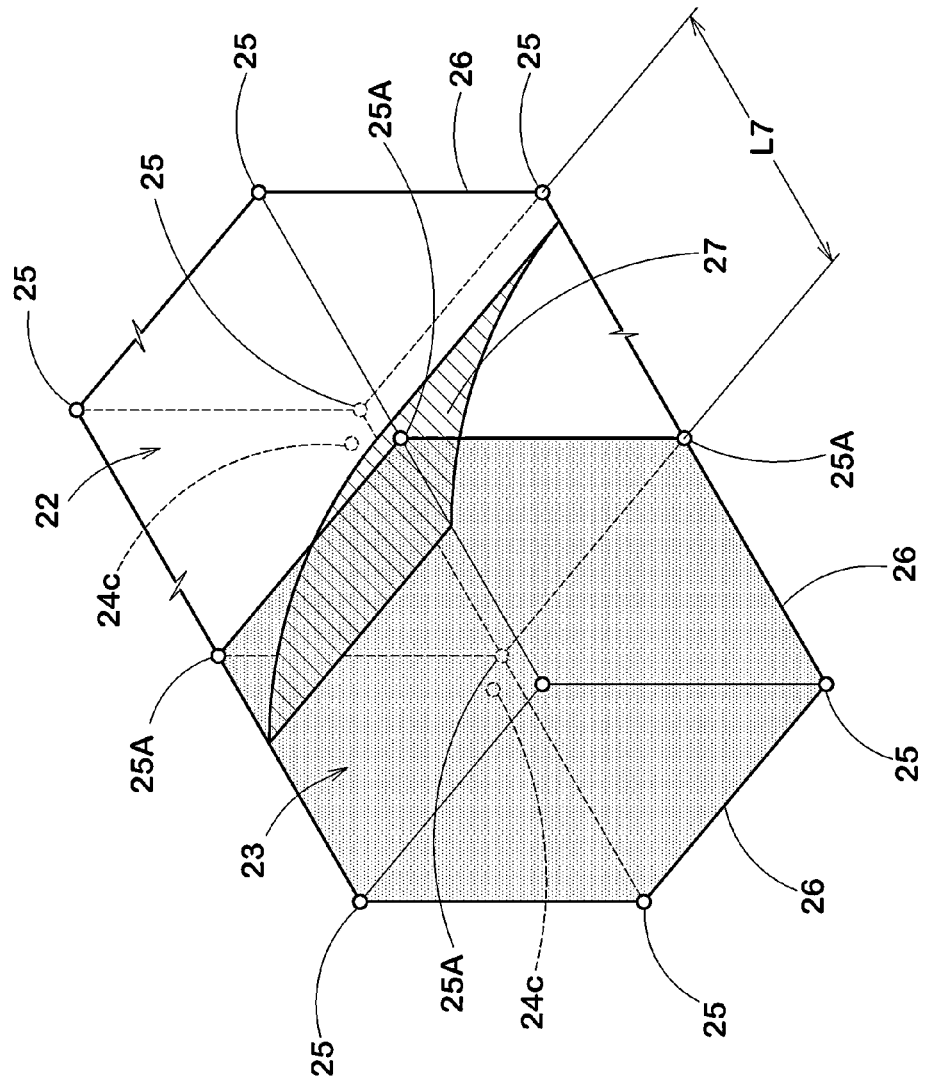
FIG. 14 is a perspective view showing hexahedron elements.

The three-dimensional space 21 is meshed with hexahedron element 24. Each hexahedron element 24 has, as shown in FIG. 14, eight nodes 25 and twelve straight sides 26 extending between the eight nodes 25, and is defined as a cube of which each side has for example a length L7 of about 0.1 to 3 nm.

In the first step S1 in this embodiment, as shown in FIG. 13, with the computer 1, the hexahedron elements 24 are each allocated to the rubber matrix (c) or one of the fillers (d) to define a rubber matrix model 22 and filler models 23. Specifically, the contours 27 (or their coordinates) of the fillers (d) (shown in FIG. 12) are superimposed on the elements 24 (or their coordinates) in the form of mesh as shown in FIG. 13. Then, the filler model 23 of each filler (d) is defined by some of the hexahedron elements 24 whose centroids 24c are within the contour 27 of the filler (d) concerned.

And by the rest of the elements 24, the rubber matrix model 22 of the rubber matrix (c) is defined.

Figure 15:
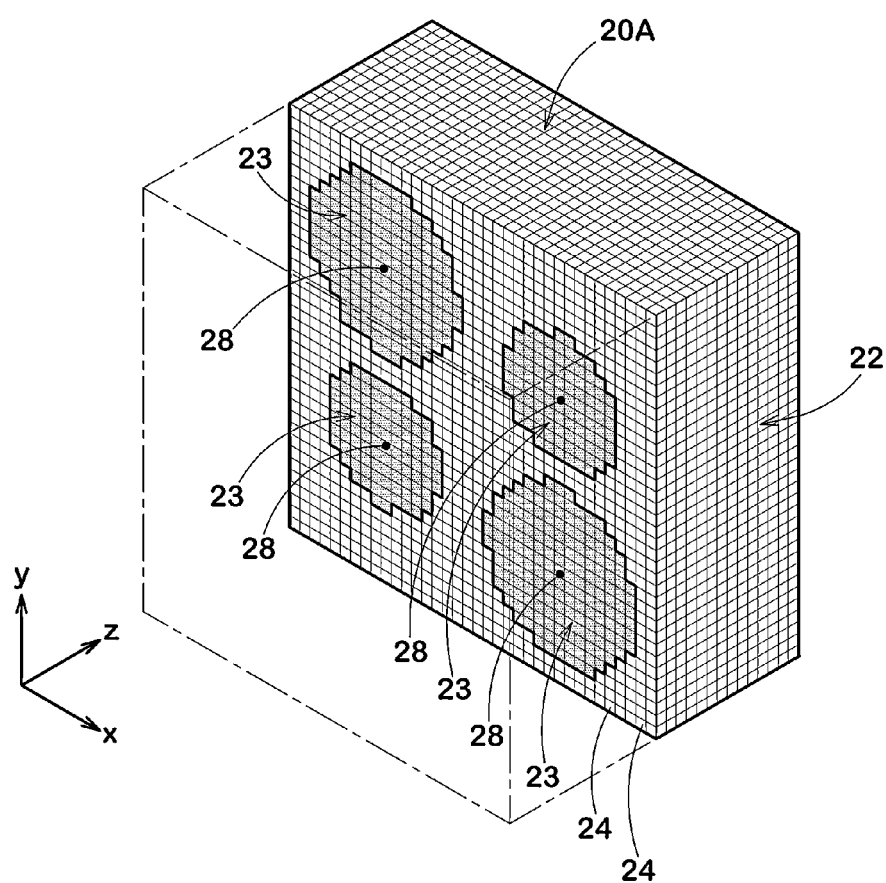
FIG. 15 is a perspective view showing a three-dimensional primary finite element model.

The computer 1 stores the data such as coordinates of each element in the filler's domain or rubber's domain in the memory. Thereby, as shown in FIG. 15, the primary finite element model 20A of the three-dimensional space 21 including the rubber matrix model 22 and the filler models 23 is defined.

In the second step S2 in this embodiment, as shown in FIG. 14, with the computer 1,
some boundary nodes 25A of the nodes 25 located at the boundaries between the rubber matrix model 22 and the filler models 23 of the primary finite element model 20A are moved so that the concavity and convexity of the surface of each filler model 23 becomes less to thereby create or redefine the second finite element model 20B (shown in FIG. 17) including the deformed hexahedron elements 24 of which boundary nodes 25A at the boundaries are moved as above.

Figure 16A:
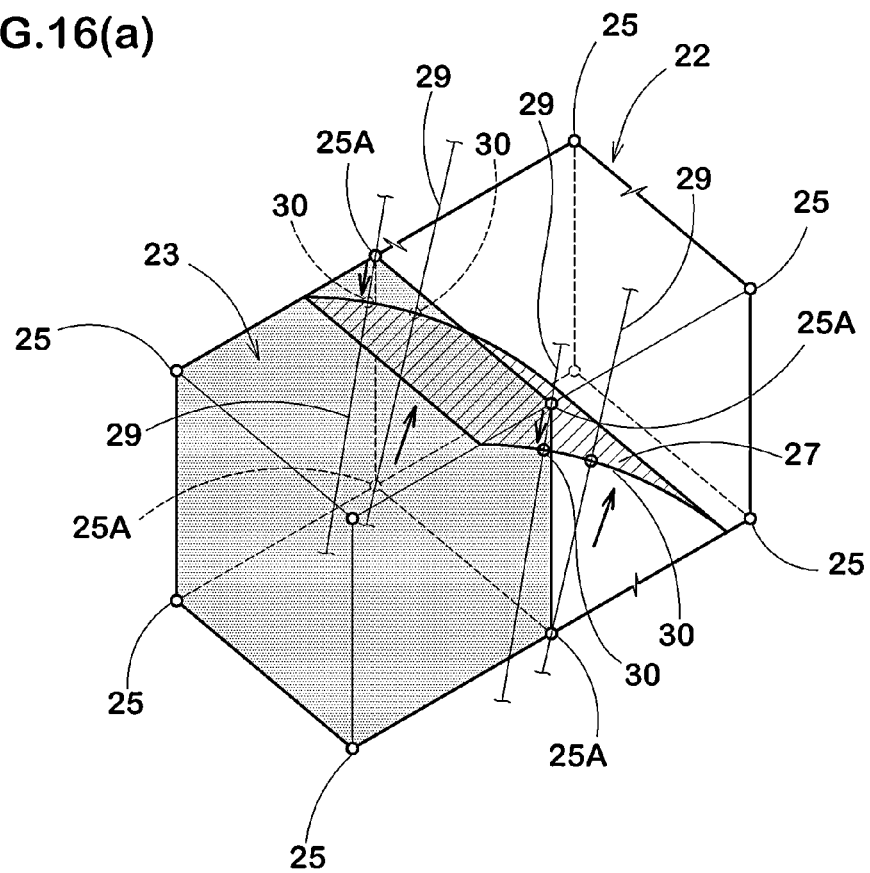
FIG. 16(a) shows hexahedron elements extracted from the model shown in FIG. 15.
Figure 16B:
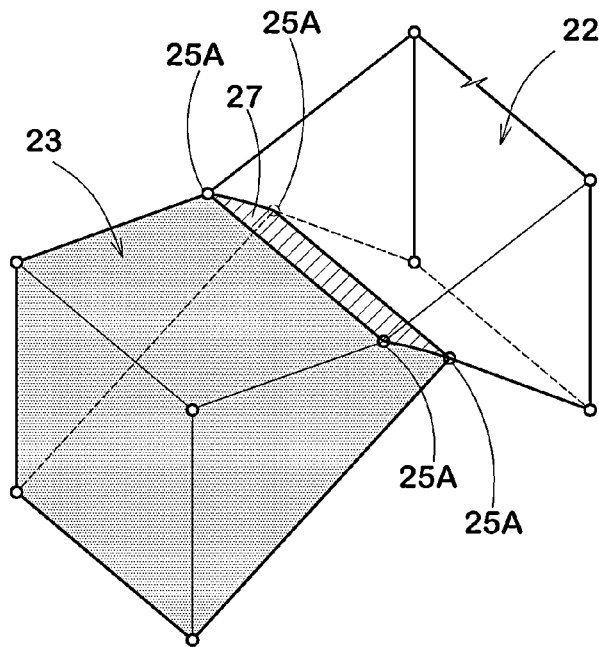
FIG. 16(b) shows deformed hexahedron elements extracted from the model shown in FIG. 17.

Specifically, as shown in FIGS. 16(a) and 16(b), with the computer 1, the boundary node 25A at the boundary is usually moved to an intersecting point 30 of the contour 27 of the filler (d) with a straight line 29 drawn passing through the boundary node 25A and centroid 28 (shown in FIG. 15) of the filler (d). Then, the computer 1 updates the coordinates of the deformed elements of the rubber matrix model 22 and the filler models 23 of the second finite element model 20B in the memory.

By the movements of the boundary nodes 25A at the boundaries, only the hexahedron elements 24 including the boundary nodes 25A are deformed, and there is defined the second finite element model 20B where the concavity and convexity of the surface of each filler model 23 is lessened as shown in FIG. 17. Further, the rest of the hexahedron element 24 none of the nodes 25 of which are positioned at the boundaries are not deformed or each maintain the same shape as in the primary finite element model 20A. Therefore, the processing time can be greatly reduced.

On each hexahedron element 24, information necessary for numerical analyses made by a computer simulation such as the coordinates and indexes (identification numbers) of the nodes 25, material constants corresponding to the physical properties of the rubber matrix (c) and material constants corresponding to the physical properties of the filler (d) are respectively defined. The computer 1 stores these data in the memory.

As explained in the former embodiment, when a plurality of the boundary nodes 25A at the boundary are located on one straight line 29, there is a possibility that these boundary nodes 25A are overlapped each other in the second step S2.

In order to avoid such overlap, before moving the boundary nodes 25A at the boundaries to the intersecting points 30 in the second step S2, similarly to the former embodiment, the computer 1 checks, with respect to each boundary, whether a plurality of the boundary nodes 25A are located on one straight line 29 and there is a possibility of their overlap. (Overlap check step)

If it is decided that there is a possibility of overlap, with the computer 1, the distances of the boundary nodes 25A at the boundary concerned from the intersecting point 30 are calculated, and the distances are modified by multiplying a coefficient in a range of more than 0 and less than 1 in order to obtain the modified distances. (Distance modify step)

Then, the boundary nodes 25A at the boundary concerned are moved toward the intersecting point 30 to different positions on the straight line 29 by the respective modified distances in stead of the original distances.

Then, the computer 1 updates the coordinates of the deformed elements as explained above.

Such overlap check step and distance modify step are carried out on all of the possible boundary nodes 7A.

Thus, the target the three-dimensional finite element model is created.

Figure 18:
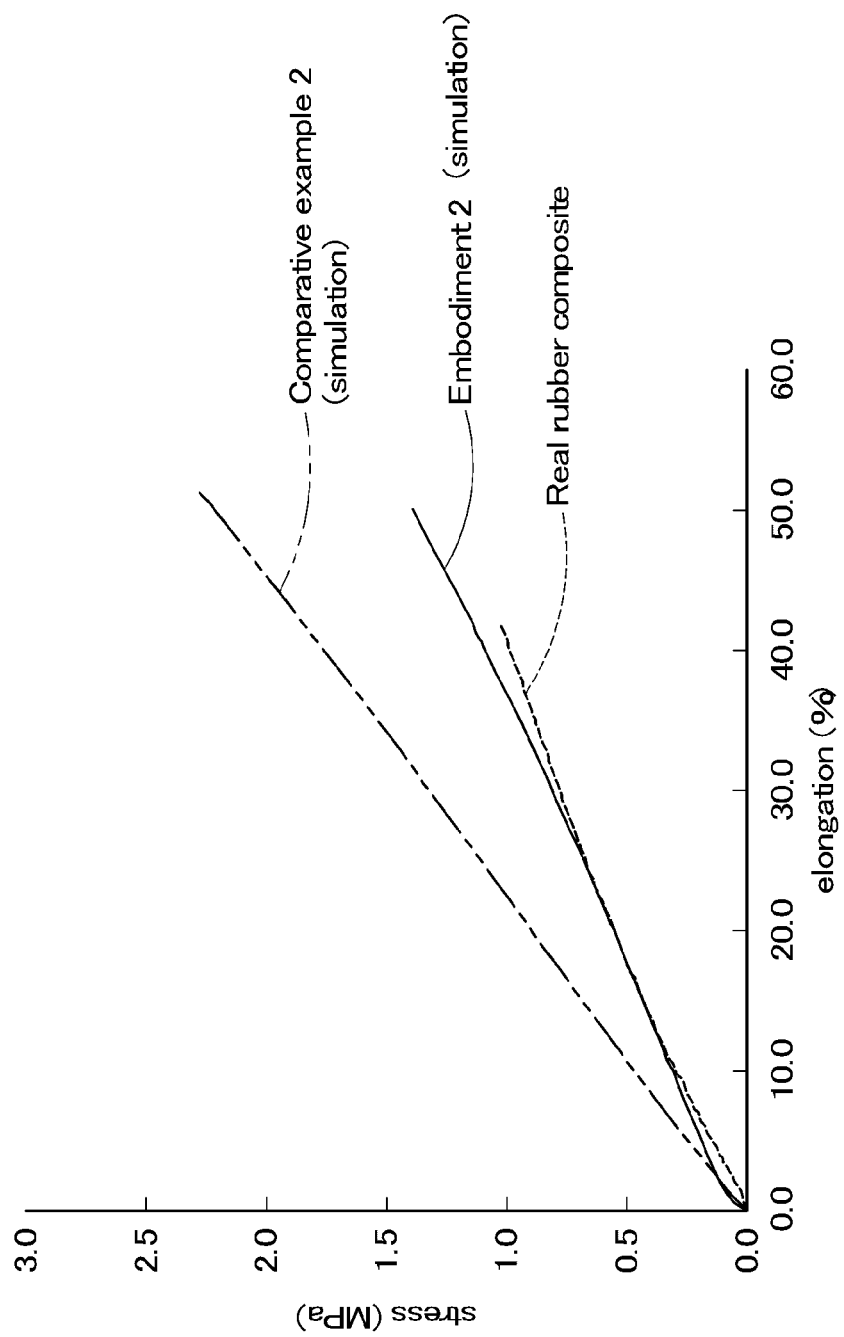
FIG. 18 is a graph showing a stress-elongation curve of the real rubber composite and those obtained by computer simulations.

In FIG. 18, the above-mentioned stress-elongation curve of the actual rubber composite (b) is again shown in broken line together with
a stress-elongation curve in solid line obtained through a computer simulation utilizing the second finite element model 20B in this embodiment (Embodiment 2) shown in FIG. 17 (number of elements: 64000), and
a stress-elongation curve in alternate long and two short dashes line obtained through the computer simulation utilizing the primary finite element model 20A (as comparative example 2) shown in FIG. 15 (number of elements: 64000). These simulation results show that the simulation accuracy of Embodiment 2 is superior to that of the comparative example 2.

The invention claimed is:

1. A computerized method for creating a two-dimensional finite element model of a rubber composite comprising a rubber matrix and fillers, comprising
    creating a primary finite element model of the rubber composite by defining a rubber matrix model of the rubber matrix and filler models of the fillers by the use of rectangular elements each having a square shape or alternatively an oblong shape, and
    creating a second finite element model as the two-dimensional finite element model by moving boundary nodes positioned at boundaries between the rubber matrix model and filler models in the primary finite element model so that concavity and convexity of the surface of each filler model becomes less, whereby, in the second finite element model, some of the rectangular elements including the moved boundary nodes are deformed and the rest of the rectangular elements are not deformed.

2. The method for creating according to claim 1, wherein
in the creating of the second finite element model, the boundary nodes at the boundary of each filler model are moved to positions on straight lines which are drawn from a centroid of the filler model to pass through said boundary nodes, respectively.

3. The method for creating according to claim 2, wherein said positions on the straight lines are the intersecting points of the straight lines with the contour of the filler corresponding to the filler model concerned.

4. The method for creating according to claim 2, wherein
in the creating of the second finite element model, before moving the nodes,
it is checked whether a plurality of boundary nodes are positioned on one straight line and there is a possibility of their overlap at one intersecting point, and
if there is a possibility of the overlap, the distances of the nodes from the intersecting point are calculated, and the distances are modified by multiplying a coefficient of more than 0 and less than 1 to obtain modified distances, then
the boundary nodes are moved to positions on the straight line at the modified distances from the intersecting point, which positions are different from each other, not to overlap each other.

5. A computerized method for creating a three-dimensional finite element model of a rubber composite comprising a rubber matrix and fillers, comprising
    creating a primary finite element model of the rubber composite by defining a rubber matrix model of the rubber matrix and filler models of the fillers by the use of hexahedron elements, and
    creating a second finite element model as the tree-dimensional finite element model by moving boundary nodes positioned at boundaries between the rubber matrix model and filler models in the primary finite element model so that concavity and convexity of the surface of each filler model becomes less, whereby, in the second finite element model, some of the hexahedron elements including the moved boundary nodes are deformed and the rest of the hexahedron elements are not deformed.

6. The method for creating according to claim 5, wherein
in the creating of the second finite element model,
the boundary nodes at the boundary of each filler model are moved to positions on straight lines which are drawn from a centroid of the filler model to pass through said boundary nodes, respectively.

7. The method for creating according to claim 6, wherein said positions on the straight lines are the intersecting points of the straight lines with the contour of the filler corresponding to the filler model concerned.

8. The method for creating according to claim 7, wherein
in the creating of the second finite element model, before moving the nodes,
it is checked whether a plurality of boundary nodes are positioned on one straight line and there is a possibility of their overlap at one intersecting point, and
if there is a possibility of the overlap, the distances of the nodes from the intersecting point are calculated, and the distances are modified by multiplying a coefficient of more than 0 and less than 1 to obtain modified distances, then
the boundary nodes are moved to positions on the straight line at the modified distances from the intersecting point, which positions are different from each other, not to overlap each other.

* * * * *